(12) United States Patent
Fertig et al.

(10) Patent No.: US 7,821,091 B2
(45) Date of Patent: Oct. 26, 2010

(54) PHOTO DETECTOR

(75) Inventors: Matthias Fertig, Altdorf (DE); Nikolaj Moll, Zurich (CH); Thomas E. Morf, Gross (CH); Thomas Pflueger, Leinfelden (DE); Jonas R. Weiss, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 12/325,195

(22) Filed: Nov. 29, 2008

(65) Prior Publication Data

US 2009/0140362 A1 Jun. 4, 2009

(30) Foreign Application Priority Data

Nov. 29, 2007 (EP) .................................. 07121872

(51) Int. Cl.
*H01L 31/052* (2006.01)
(52) U.S. Cl. ................ 257/436; 257/432; 257/E31.127
(58) Field of Classification Search ................ 257/432, 257/436, E31.127
See application file for complete search history.

(56) References Cited

U.S. PATENT DOCUMENTS 4,989,972 A * 2/1991 Braun ........................ 356/225
5,703,675 A * 12/1997 Hirukawa et al. ............. 355/53
5,853,960 A * 12/1998 Tran et al. .................... 430/321
6,121,667 A * 9/2000 Lee ............................. 257/448
6,594,422 B2 * 7/2003 Taylor et al. ................... 385/37
6,878,959 B2 * 4/2005 Bour et al. ..................... 257/14
7,110,034 B2 * 9/2006 Suda .......................... 348/340
7,245,324 B2 * 7/2007 Namazue et al. ............ 348/340
7,495,305 B2 * 2/2009 May et al. .................... 257/432
2009/0272880 A1 * 11/2009 Stanton et al. ............ 250/208.1
2009/0273049 A1 * 11/2009 Fattal et al. ................. 257/432

* cited by examiner

*Primary Examiner*—Allan R Wilson
(74) *Attorney, Agent, or Firm*—Ido Tuchman; Kenneth R. Corsello

(57) ABSTRACT

A photo detector comprising a grating (PC). The grating (PC) is arranged on top of a surface of an active semiconductor layer. The grating (PC) is patterned in uninterrupted first strips (ST1), that are arranged in a first direction (x) in a first predetermined interval (a), and second strips (ST2), that are arranged in a second direction (y) in a second predetermined interval (b). The second strips (ST2) each comprise at least one interruption in a region between each two neighboring first strips (ST1) in form of a predetermined gap (d). Positively doped regions (P) and negatively doped regions (N) each are arranged as strips in parallel with the first strips (ST1) such that in a region between each two neighboring first strips (ST1) alternately either one of the positively doped regions (P) or one of the negatively doped regions (N) is arranged.

20 Claims, 3 Drawing Sheets

PHOTO DETECTOR

CROSS-REFERENCE TO RELATED APPLICATIONS

This application claims priority under 35 U.S.C. §119 to European Patent Office Application No. 07121872.1 filed Nov. 29, 2007, the entire text of which is specifically incorporated by reference herein.

BACKGROUND OF THE INVENTION

The present invention relates to a photo detector and particularly relates to a photo detector for optical chip to chip communication.

The design of on-chip optical inputs and outputs for optical chip to chip communication is restricted by the fact that the implementation of photo detectors in CMOS integrated circuits is very challenging. Silicon is a suitable semiconductor for short wavelength photo detectors. A CMOS process, or even better a BICMOS process, offers a range of different designs of pn-junctions which can be used as photo detectors. However, the doping levels for these pn-junctions are very high. As a result, a depletion region of these pn-junctions is very narrow, for example approximately 50 nm to 100 nm, and, as a consequence, the volume which can be used to absorb photons is small. This results in a small responsivity of the photo detector. The narrow depletion region further results in high junction capacitances, which severely limit a frequency response of such a photo detector.

When implementing photo detectors in silicon on insulator, or abbreviated SOI, the CMOS manufacturing process is even more challenging. In a SOI CMOS manufacturing process the bulk silicon only serves as a mechanical substrate and has no electrical function. The active silicon layer may have a thickness of only, for example, approximately 70 nm. Silicon has an absorption length of roughly 15 µm for light with a wavelength of 850 nm. As a result, 1/e of the light is absorbed after 15 µm in silicon. Thus, a 70 nm silicon layer is virtually transparent for light of that wavelength. A shorter wavelength results in a shorter absorption length. However, the 70 nm silicon layer is too thin for all practical wavelengths.

It is therefore a challenge to provide a photo detector that is simple and efficient.

BRIEF SUMMARY OF THE INVENTION

According to a first aspect of an embodiment of the invention a photo detector comprises an active semiconductor layer and a grating of a grating material. In the active semiconductor layer positively doped regions and negatively doped regions are formed, each comprising at least one electric contact area. The grating is directly or indirectly arranged on top of a surface of the active semiconductor layer. The grating is patterned in uninterrupted first strips, that are arranged in a first direction and in parallel to each other with respect to their respective center lines in a first predetermined interval, and second strips, that are arranged in a second direction and in parallel to each other with respect to their respective center lines in a second predetermined interval. The second strips each comprise at least one interruption in a region between each two neighboring first strips in form of a predetermined gap. The positively doped regions and negatively doped regions each are arranged as strips in parallel with the first strips of the grating material with respect to their respective center lines such that in a region between each two neighboring first strips of the grating material in their respective projections into the active semiconductor layer alternately either one of the positively doped regions or one of the negatively doped regions is arranged.

The grating has the function of a diffraction grating that bends incident electromagnetic waves into the active semiconductor layer. In the active semiconductor layer a larger absorption length can be achieved that is essentially independent of a thickness of the active semiconductor layer. The photo detector can thus advantageously be manufactured without compromising on its performance in a silicon on insulator manufacturing process. The grating material may be transparent, which may result in a shift of both phase and amplitude of the electromagnetic waves, or the grating material may be non-transparent, which may result in a shift of only the amplitude of the electromagnetic waves.

The predetermined gaps in the second strips of the grating material allow for arranging the respective positively doped region and the respective negatively doped region in form of uninterrupted strips in parallel to the first strips of the grating material. Even when the grating is used as a mask for forming the positively doped regions and negatively doped regions during the manufacturing process the positively doped regions and the negatively doped regions are not interrupted by the second strips of the grating material because of the respective predetermined gap between each two neighboring first strips. The photo detector may therefore be manufactured efficiently by using the grating as the mask.

Because of the first strips of the grating material and the positively doped regions and the negatively doped regions being arranged as parallel strips with respect to their respective center lines the photo detector has a simple structure and is simple to implement. Only few contact areas for electrically contacting the respective positively doped region or negatively doped region and few conductors contacting the respective contact areas may be used to discharge a photo current generated by photons absorbed in the active semiconductor layer and particularly in a depletion region, which is formed between each neighboring positively doped region and negatively doped region. The respective contact areas may be arranged in relatively large intervals along each strip of a positively doped region and each strip of a negatively doped region. Preferably, a distance between each two consecutive contact areas on each single strip amounts to approximately 2 to 3 µm. The distance between each two consecutive contact areas influences the series resistance as well as the area of the photo detector that is covered by conductors or wiring, for example metal for contacting each positively doped region and negatively doped region, and thus cannot contribute to the photo current. There is a tradeoff between short distances between each two consecutive contact areas within each positively doped region and negatively doped region to achieve a desired receiver switching speed and long distances to provide a suitable amount of active area to incident light.

Another advantage is that the grating with its first strips arranged in the first direction and its second strips arranged in the second direction, which is different from the first direction, allows for capturing more than one polarization of the incident electromagnetic waves. Particularly, this design of the grating may allow for capturing both s-polarization and p-polarization of the incident electromagnetic waves. By this, more photons can enter the active semiconductor layer and can be absorbed to produce a photo current. As a result, the photo detector can be very efficient and can have a high responsivity. Further, the first and the second predetermined interval can be selected independently for capturing s- and p-polarization, respectively. By this, the performance of the photo detector can be optimized to efficiently absorb both the s- and the p-polarization. The first direction and the second direction preferably are selected as being perpendicular to each other.

The photo detector is advantageously produced in a CMOS manufacturing process and particularly in a silicon on insulator CMOS manufacturing process. The photo detector is thus integrable into VLSI or ASIC designs. The photo detector is preferably integrated monolithically on a single chip with a circuit arrangement that comprises at least one field effect transistor.

With respect to a gap size of the predetermined gaps there is a tradeoff when the photo detector is designed with respect to a semiconductor process in which the grating is used as the mask for defining the positively doped regions and negatively doped regions. A small predetermined gap causes a high series resistance along the respective positively or negatively doped region and/or causes a large capacitance because of a large enclosing surface of depleted volume between each two neighboring positively and negatively doped regions. On the other hand, the small predetermined gap positively influences the efficiency of the photo detector. Generally, the small predetermined gap optically has only a minor influence on the performance of the photo detector and a high efficiency can be achieved for both s- and p-polarization. It may be advantageous if the predetermined gap is predetermined as a gap having a minimum gap size available in the manufacturing process used for producing the photo detector.

The grating material preferably is a gate-material used for gates of field effect transistors according to the manufacturing process. The grating material preferably is a polycrystalline silicon. The advantage is, that the grating can be manufactured within the same process step in which gates of field effect transistors are manufactured without additional masks, for example the gates of the at least one field effect transistor in the circuit arrangement the photo detector is integrated with. As a result, a modification of the manufacturing process is not required and the photo detector and, if applicable, also the circuit arrangement can be manufactured in a general manufacturing process. This allows for low cost integration of on-chip optical inputs for optical chip to chip communication.

According to a second aspect of an embodiment of the invention a photo detector comprises an active semiconductor layer and a grating of a grating material. In the active semiconductor layer positively doped regions and negatively doped regions are formed, each comprising at least one electric contact area. The grating is directly or indirectly arranged on top of a surface of the active semiconductor layer. The grating is patterned in strips of the grating material, each strip comprising at least two sections arranged in two different directions. All sections arranged in a first direction of the two different directions are arranged in parallel to each other in a first predetermined interval and all sections arranged in a second direction of the two different directions are arranged in parallel to each other in a second predetermined interval. The positively doped regions and negatively doped regions each are arranged as strips in parallel with the respective sections of the strips of the grating material with respect to their respective center lines such that in a region between each two neighboring strips of the grating material in their respective projections into the active semiconductor layer alternately either one of the positively doped regions or one of the negatively doped regions is arranged.

The photo detector according to the second aspect exhibits essentially the same advantages as the photo detector according to the first aspect.

According to a third aspect of an embodiment of the invention a photo detector comprises an active semiconductor layer, in which positively doped regions and negatively doped regions are formed, each comprising at least one electric contact area. A grating of a grating material is directly or indirectly arranged on top of a surface of the active semiconductor layer. The grating comprises at least one area being patterned in strips of the grating material, each strip comprising at least two sections arranged in two different directions. All sections arranged in a first direction of the two different directions are arranged in parallel to each other in a first predetermined interval and all sections arranged in a second direction of the two different directions are arranged in parallel to each other in a second predetermined interval. The grating further comprises at least one area being patterned in uninterrupted first strips, that are arranged in a third direction and in parallel to each other with respect to their respective center lines in a third predetermined interval, and second strips, that are arranged in a fourth direction and in parallel to each other with respect to their respective center lines in a fourth predetermined interval, wherein the second strips comprise at least one interruption in a region between each two neighboring first strips in form of a predetermined gap. The positively doped regions and negatively doped regions each are arranged as strips in parallel with the respective sections of the strips of the grating material and in parallel with the first strips of the grating material, respectively, with respect to their respective center lines such that in a region between each two neighboring strips of the grating material and neighboring first strips of the grating material, respectively, in their respective projections into the active semiconductor layer alternately either one of the positively doped regions or one of the negatively doped regions is arranged.

The photo detector according to the third aspect exhibits essentially the same advantages as the photo detectors according to the first and the second aspect. The third direction may advantageously be equal to the first direction and/or the fourth direction may advantageously be equal to the second direction. The third predetermined interval may advantageously be equal to the first predetermined interval and/or the fourth predetermined interval may advantageously be equal to the second predetermined interval.

According to a preferred embodiment of the invention, each strip of the grating material with its respective sections is arranged in a zigzag pattern. The advantage is that such photo detector has a very simple structure with its parallel strips each being arranged in the zigzag pattern.

According to a preferred embodiment of the invention, the active semiconductor layer is arranged on top of a dielectric layer having a lower refractive index than the active semiconductor layer and the grating material. Further, the active semiconductor layer and the grating are covered with at least one cover material having a lower refractive index than the active semiconductor layer and the grating material. By this, a waveguide is formed between the dielectric layer and the layer of the at least one cover material. The electromagnetic waves can thus be guided along the waveguide and a great absorption length can be achieved. The dielectric layer preferably is configured as a buried oxide layer as provided in a silicon on insulator manufacturing process. The at least one cover material may be air, glass or a glass-like material, such as for example silicon dioxide, or another suited material with a low refractive index available in the manufacturing process.

It is advantageous that the active semiconductor layer has a thickness of less than 200 nm to fabricate silicon on insulator field effect transistors, that is SOI FETs. However, in general such thin active semiconductor layers create huge challenges for optical detectors. In particular the presented approach enables photo detectors despite the thin active semiconductor layers available in a SOI manufacturing process. The thickness of the active semiconductor layer could thus be far smaller than the wavelength of the incident electromagnetic waves.

According to a further preferred embodiment of the invention the positively doped regions and the negatively doped regions in the active semiconductor layer respectively extend at least to a border of the projection into the active semiconductor layer of the respective neighboring first strips or strips of the grating material, respectively. This is easily achieved by using the grating as a mask in the manufacturing process for forming the positively doped regions and the negatively doped regions. The photo detector can thus be easily and precisely produced within, for example, a general CMOS or SOI CMOS manufacturing process.

According to a further preferred embodiment of the invention at least part of a region of the projection into the active semiconductor layer of the respective first strip or strip of the grating material, respectively, in the active semiconductor layer is intrinsic or lowly doped. The advantage is that by this a pin-diode structure is provided. This makes the photo detector well suited for high frequency operation and, as a result, for high speed optical chip to chip communication.

According to a further preferred embodiment according to the first and the second aspect, respectively, between the grating and the active semiconductor layer a thin dielectric layer is arranged. Particularly, the thickness of this thin dielectric layer is small in comparison to the thickness of the grating or the thickness of the active semiconductor layer. Advantageously, the thickness of the thin dielectric layer is of the order of magnitude of about 1 nm or amounts to about 1 nm. The thin dielectric layer advantageously is formed by a gate dielectric layer used for isolating the gates of field effect transistors according to the manufacturing process, particularly the CMOS or SOI CMOS manufacturing process. The advantage is that the insulation provided by the thin dielectric layer between the grating and the active semiconductor layer allows for supplying an electrical bias potential to the strips of the grating material. This can be used to influence the depletion region between each pair of neighboring positively doped region and negatively doped region. By this, the depletion region can advantageously be enlarged. Charge carriers, particularly electrons and holes, respectively generated by absorption of photons of the incident electromagnetic waves, thus have a greater chance to contribute to the photo current. As a result, the photo detector can be particularly efficient.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

DETAILED DESCRIPTION OF THE INVENTION

Figure 2:
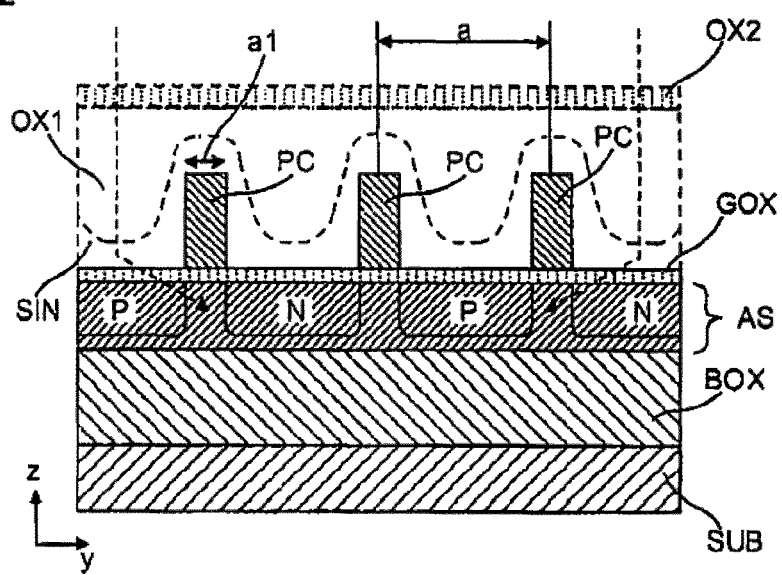

In a silicon on insulator manufacturing process, abbreviated SOI process, an absorbing optical waveguide is formed by an active semiconductor layer AS, for example an active silicon layer, together with a dielectric layer, on top of which the active semiconductor layer AS is arranged, and at least one cover layer covering the active semiconductor layer on its other side (FIG. 2). A refractive index of, for example, silicon is considerably higher than a refractive index of, for example, silicon dioxide and, for example, a material used to form the at least one cover layer. The dielectric layer is also called a buried oxide layer BOX and may be formed as a silicon dioxide layer. The buried oxide layer BOX may be arranged on top of a substrate SUB, which for example functions as a mechanical base and is for example provided as a silicon substrate. The at least one cover layer may be air or glass or a glass-like material or may be any other material transparent enough for incident electromagnetic waves, particularly light, of a predetermined wavelength λ or a predetermined range of wavelengths λ and having a suitable low refractive index. For example, dielectrics used to insulate metal layers on a chip may be used to form the at least one cover layer. For example, a first cover layer OX1 and a second cover layer OX2 are provided as two cover layers.

This absorbing waveguide can be used to form a photo detector. Utilizing the waveguide for the photo detector has the advantage that an absorption length for photons in the waveguide can be long enough to achieve good absorption rates. However, it is a challenge to guide the electromagnetic waves into such waveguide. Feeding light from the side is impractical since the active silicon layer, that is the active semiconductor layer AS, as provided in the SOI process is generally in the order of hundreds of nanometers thick or less. Therefore, a means for bending vertically incident electromagnetic waves into the waveguide is needed. Electromagnetic waves can be fed into the waveguide using a second order grating PC on top of the active semiconductor layer AS. This grating PC can advantageously be formed of poly-silicon as a grating material, that is polycrystalline silicon, which is generally available in a CMOS manufacturing process and also in the SOI process. In such manufacturing processes poly-silicon is used as a gate material for gates of field effect transistors. Preferably, a deep submicron manufacturing process is used for manufacturing the photo detector comprising the waveguide and the grating PC, since small dimensions are required for practically relevant wavelengths. It is pointed out here that the photo detector comprising the waveguide is presented here as an example. The waveguide is an advantageous feature of the photo detector. But the photo detector can also be implemented without the waveguide and, for example, with the active semiconductor layer AS being thicker than that provided in the SOI process and/or without the buried oxide layer BOX.

Figure 1A:
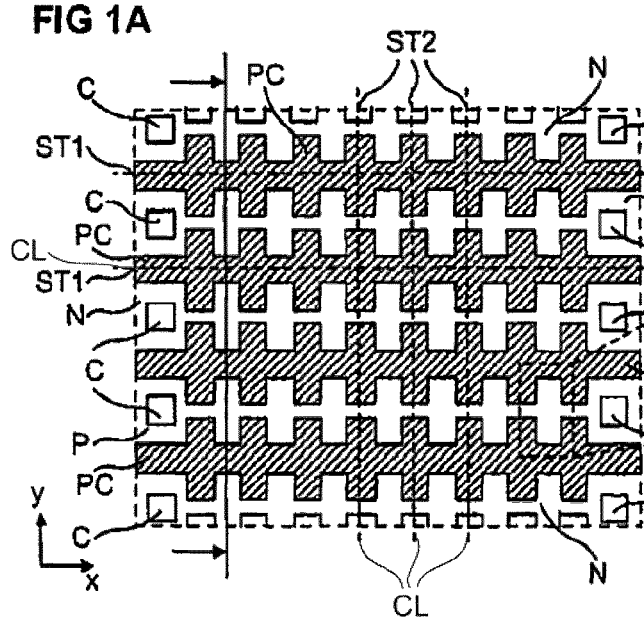
FIG. 1A, a top view of a first embodiment of a photo detector.
Figure 1B:
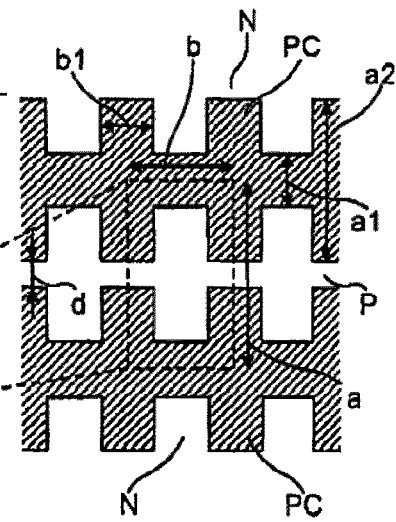
FIG. 1B, a magnified part of the top view of the first embodiment of the photo detector, FIG. 2, a cross-sectional view of the photo detector, FIG. 3A, a diagram showing a simulated absorption of the photo detector as shown in FIG. 1 with a1=a2, as a function of a wavelength of incident light with s-polarization for different predetermined intervals, FIG. 3B, a diagram showing a simulated absorption of the photo detector as shown in FIG. 1 with a1=a2, as a function of a wavelength of incident light with p-polarization for different predetermined intervals, FIG. 4, a diagram showing a simulated total absorption of the photo detector as shown in FIG. 1 as a function of a wavelength of incident light for both s- and p-polarization, FIG. 5A, a top view of a first example of a second embodiment of the photo detector and FIG. 5B, a top view of a second example of the second embodiment of the photo detector.

FIG. 1A shows a top view of a first embodiment of the photo detector and FIG. 1B shows a magnified section of this top view. The grating PC is arranged in first strips ST1 of the grating material and second strips ST2 of the grating material, which are arranged in two different directions. The first strips ST1 are arranged in a first direction x of the two different directions and the second strips ST2 are arranged in a second direction y of the two different directions. The first and the second direction x, y are advantageously selected as being perpendicular to each other. However, the first and the second direction x, y may alternatively be selected to include an angle smaller or larger than ninety degrees. The first strips ST1 are formed as uninterrupted strips, that is the grating material forms a continuous strip from one end of the strip to the other. To achieve a required photo detector area, the pattern shown in FIG. 1A may be repeated in the first direction x and/or in the second direction y.

The second strips ST2 are formed as interrupted strips. Each second strip ST2 comprises at least one interruption between each respective neighboring first strips ST1. The at least one interruption is advantageously formed by a predetermined gap d. A gap size of the predetermined gap d is advantageously predetermined dependent on the manufacturing process used for manufacturing the photo detector and may particularly be predetermined as a smallest gap size available in this manufacturing process. However, the gap size of the predetermined gap d may alternatively be predetermined to be greater than the smallest available gap size. The first strips ST1 are arranged in parallel to each other with respect to their respective center lines CL in a first predetermined interval a. The second strips ST2 are arranged in parallel to each other with respect to their respective center lines CL in a second predetermined interval b.

Viewed from top, between each first strip ST1 and in parallel to these with respect to the respective center lines is arranged in alternating order either a positively doped region P or a negatively doped region N. Because of the at least one interruption in each second strip ST2 between each two neighboring first strips ST1 the positively doped regions P and the negatively doped regions N are respectively formed as uninterrupted strips, that is each of the positively doped regions P and negatively doped regions N is not interrupted by any structure of the grating PC. This particularly also applies in case the grating PC is used as a mask for defining the positively doped regions P and negatively doped regions N during the manufacturing process of the photo detector.

Each of these strips, that is each positively doped region P and each negatively doped region N, comprises at least one contact area C for electrically contacting the respective positively or negatively doped region P, N for example with a conductor or wire for discharging a photo current. Because the positively doped regions P and the negatively doped regions N are respectively formed as uninterrupted strips, if more than one contact area C is provided for at least one of the positively or negatively doped regions P, N, for example one at each end of the respective uninterrupted strip of the positively or negatively doped regions P, N, there is an ohmic electrical connection between each two such contact areas C.

Optically it is desirable to have only few contact areas C placed far apart from each other so that ideally none of the incident electromagnetic waves is blocked out by the conductors or wiring. Electrically it is desirable to have the contact areas placed close together such that the charge carriers created by absorption of a photon only have to cover a short distance through the respective positively or negatively doped region P, N to the at least one contact area C such that an electrical resistance is small. The photo detector design presented here allows for finding a good compromise. The respective at least one contact area C can be placed almost anywhere along the uninterrupted strips of the positively and negatively doped regions P, N, respectively, and thus the distance between each two consecutive contact areas C, if more than one is provided per strip, can be selected according to the needs. For example, this distance advantageously is selected to be about 2 to 3 μm. However, a shorter or longer distance may alternatively be chosen.

Advantageously, all positively doped regions P are connected with a first conductor, which is not shown in the figures, and all negatively doped regions N are connected with a second conductor, which is also not shown in the figures. Further, the contact areas C of the positively doped regions P and the contact areas C of the negatively doped regions N are advantageously arranged displaced to each other in the first direction x. This allows for arranging the first conductor and the second conductor in parallel to each other in the second direction y. It is further advantageous to share contact areas C between subsequent parallel arrangements of the photo detector as shown in FIG. 1A such that, for example, the first conductor in the first direction x is followed by a number of second strips ST2, after which the second conductor is arranged, followed by a number of second strips ST2, which is again followed by the first conductor and so forth. By this, a large usable photo detector area, a small capacitance and high switching frequencies can be achieved.

Advantageously, the first and second conductor are arranged with respect to the grating PC and in particular with respect to the second strips ST2 of the grating PC such that the conductors with respect to the optical properties of the photo detector form a part of the grating PC and thus enhance its effect of bending the incident electromagnetic waves into the waveguide and particularly into the active semiconductor layer AS. This can be achieved by selecting a distance of the respective conductor to a respective neighboring second strip ST2 or conductor dependent on the second predetermined interval b. By this, the conductors optically function similar to the second strips ST2 and even though the conductors or the wiring are formed of a material, for example a metal, that is opaque with respect to the wavelength λ or the range of wavelengths λ of the incident electromagnetic waves, the performance of the photo detector can be enhanced.

With respect to the gap size of the predetermined gap d a tradeoff may be considered. A small predetermined gap d causes a high electrical resistance along the respective positively or negatively doped region P, N and/or causes a large capacitance because of a large enclosing surface of depleted volume between each two neighboring positively and negatively doped regions P, N. On the other hand, the small predetermined gap d positively influences the efficiency of the photo detector. Generally, the small predetermined gap optically has only a minor influence on the performance of the photo detector and a high efficiency can be achieved for both s- and p-polarization.

The grating PC is further defined by a first width a1, a second width a2 and a third width b1 of the grating material. The first width a1 represents a width of the first strips ST1 in a region between each two neighboring second strips ST2. The second width a2 represents a width of the first strips ST1 in a region of one of the second strips ST2 or a length of a segment of the respective second strip ST2. Further, the third width b1 represents a width of the respective second strip ST2. The first width a1 and the third width b1 are advantageously selected dependent on a ratio of refractive indices of the grating material and a material covering the grating PC. For example, the grating PC is covered with a silicon nitride layer SIN (FIG. 2), but the photo detector can also be provided without the covering material. By providing the covering material and by suitably selecting the refractive indices of the grating material and the covering material and by suitably selecting the first and the second width a1, b1 low reflection of incident electromagnetic waves at a surface of the photo detector and thus a high efficiency of the photo detector can be achieved. The second width a2 is determined dependent on the position of the respective at least one predetermined gap d and is advantageously selected to be greater or equal to the first width a1. It is pointed out here that it is not required that the second strips ST2 are connected to the first strips ST1 but it is advantageous that the second strips ST2 are connected to the first strips ST1 as shown in FIGS. 1A and 1B. However, the position of the respective predetermined gap d may be selected differently. Thus, advantageously, in each second strip ST2 only one predetermined gap d is provided between each two neighboring first strips ST1 resulting in a second width a2 that is greater than the first width a1.

Advantageously, a region between each two neighboring positively and negatively doped regions P, N is intrinsic or lowly doped. By this, a pin-diode is formed. Particularly, this respective intrinsic or lowly doped region is located in a region within a projection of the respective first strip into the active semiconductor layer AS (FIG. 2). A depletion region of the respective pin-diode is then mainly located in this region. Simulations showed that most of the photons of the incident electromagnetic waves are absorbed in this region, which is desirable. The respective positively and negatively doped regions P, N extend at least to a border of this respective projection. This may be achieved by using the grating PC as a mask for forming the positively doped regions P and the negatively doped regions N during the manufacturing process. The positively and negatively doped regions P, N are also called P- and N-wells, respectively, and correspond to P-wells and N-wells used for PFETs and NFETs, respectively, that is p-channel and n-channel field effect transistors, respectively.

As is shown in FIG. 2, a thin dielectric layer is provided between the grating PC and the active semiconductor layer AS. The thin dielectric layer advantageously is a gate dielectric layer GOX with a thickness of, for example, about 1 nm. The grating PC can thus be manufactured in the same way and particularly in the same process step as gates of field effect transistors. Advantageously, the grating PC and particularly the first strips ST1 are supplied with a bias potential such that the depletion region between each two neighboring positively and negatively doped regions P, N is enlarged. By this, photons can be absorbed efficiently.

Figure 3A:
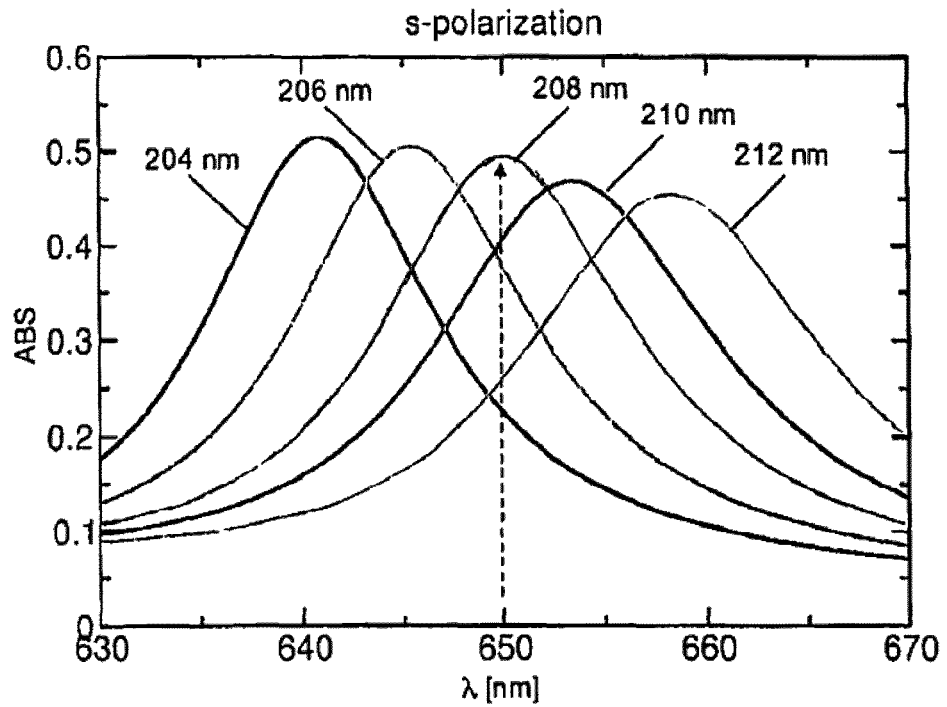
Figure 3B:
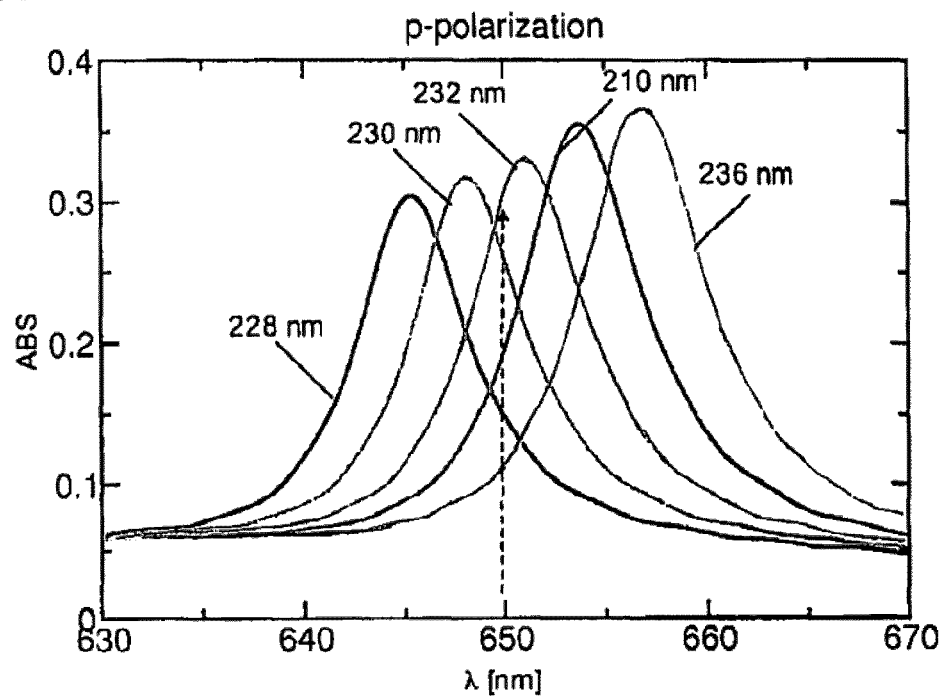

In FIG. 3A a diagram is shown with a simulated absorption ABS of photons in the photo detector as a function of a wavelength λ of incident light with s-polarization for different predetermined intervals for the photo detector as shown in FIGS. 1A and 1B with the first width a1 and the second width a2 being equal. In FIG. 3B a diagram is shown with a simulated absorption ABS of photons in the photo detector as a function of a wavelength λ of incident light with p-polarization for different predetermined intervals for the photo detector as shown in FIGS. 1A and 1B with the first width a1 and the second width a2 being equal. For example, for incident light with the wavelength λ of 650 nm and s-polarization the optimum grating period, that is the optimum first predetermined interval a, to maximize the absorption ABS is 208 nm. However, for the p-polarization the optimum grating period, that is the optimum first predetermined interval a, is larger and around 232 nm. There is no wavelength where for both polarizations the same grating period is optimal. However, as the light is generally fed into the photo detector by a multi mode waveguide or fiber, which is not polarization preserving, both polarizations generally are present in equal magnitude. Using only one polarization would reduce the efficiency of the photo detector by a factor of two.

With the grating PC shown in FIG. 1A and FIG. 1B the first predetermined interval a and the second predetermined interval b can be selected and optimized independently such that both s- and p-polarization can be absorbed efficiently. For example, the first predetermined interval a can be selected with respect to the grating period needed for capturing the s-polarization of the incident electromagnetic waves and the second predetermined interval b can be selected with respect to the grating period needed for capturing the p-polarization of the incident electromagnetic waves or vice versa. Thus, the absorption ABS for both polarizations can be increased or maximized. As further parameters, the first, second and third width a1, a2, b1 can be optimized so that the absorption ABS of photons in the photo detector is maximized for the predetermined wavelength λ or predetermined range of wavelengths λ of the incident electromagnetic waves and by this also the generated photo current can be maximized. Furthermore, these additional degrees of freedom can lead to a finer tuned grating PC which then exhibits larger absorption ABS even for a single polarization.

Figure 4:
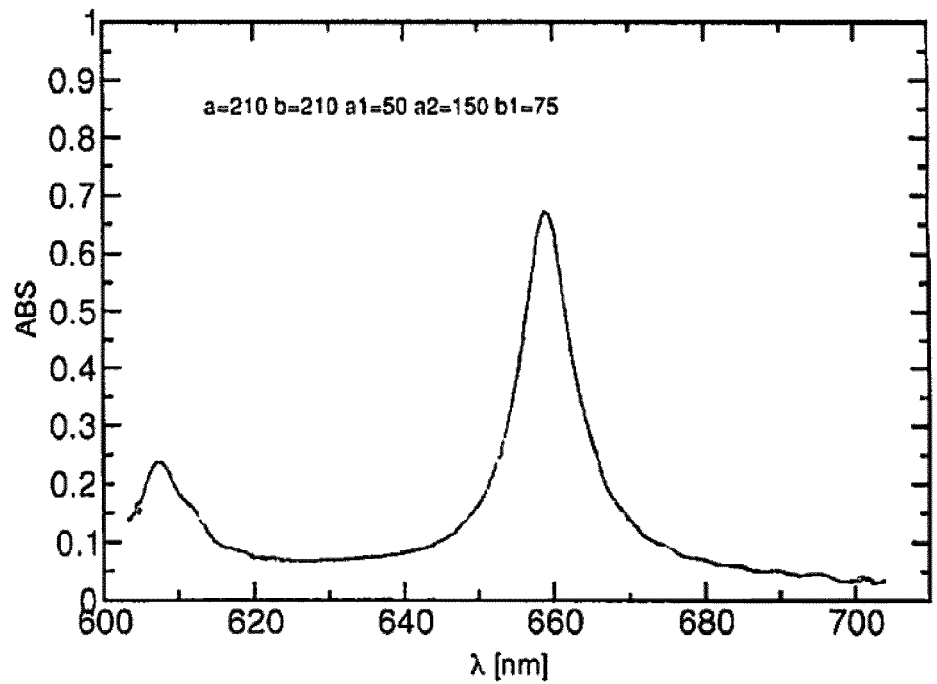

FIG. 4 shows a simulated resulting absorption ABS for both s- and p-polarization of the incident electromagnetic waves for gratings PC with the first predetermined interval a selected as 210 nm. The other parameters, that is the second predetermined interval b, the first width a1, the second width a2 and the third width b1, in this example are selected as b=210 nm, a1=50 nm, a2=150 nm and b1=75 nm. However, other values could alternatively be selected according to the needs. In this example, the simulated total absorption ABS for both the s- and p-polarization amounts to over 60% for suitable wavelengths λ.

Figure 5A:
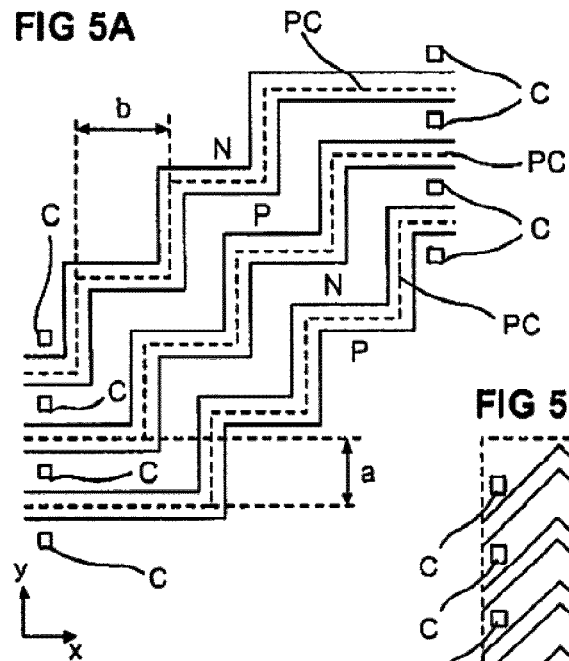
Figure 5B:
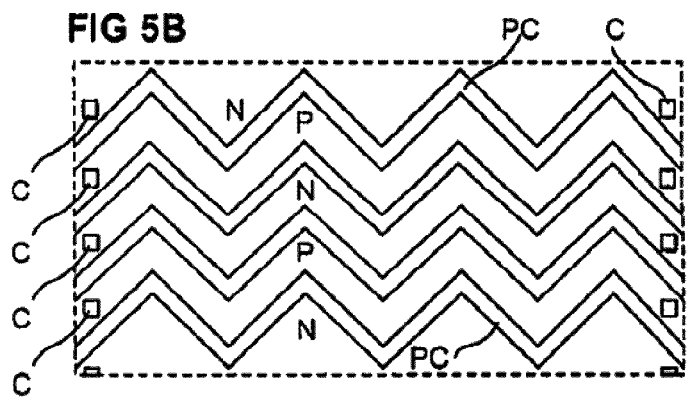

FIG. 5A and FIG. 5B show a first and a second example of a second embodiment of the photo detector. The second embodiment of the photo detector essentially functions in the same way as the first embodiment of the photo detector described above and exhibits essentially the same advantages. However, the grating PC in the second embodiment is differently patterned. Each strip of the grating material comprises at least two sections arranged in two different directions. Advantageously, these two different directions are selected to be perpendicular to each other but other angles than ninety degrees may alternatively be chosen. All sections arranged in the first direction x of the two different directions are arranged in parallel to each other with respect to their respective center lines and all sections arranged in the second direction y of the two different directions are arranged in parallel to each other with respect to their respective center lines. Sections arranged in the first direction x and sections arranged in the second direction y are arranged in alternating order in each strip of the grating material. This advantageously results in a zigzag pattern of each of the strips. Sections arranged in the first direction x advantageously are arranged in the first predetermined interval a and sections arranged in the second direction y advantageously are arranged in the second predetermined interval b. The first and the second predetermined interval a, b, just as in the first embodiment of the photo detector, can be selected to be equal or can be selected independently of each other with respect to the polarizations to capture and the wavelengths λ of the incident electromagnetic waves to capture.

The first example of the second embodiment shown in FIG. 5A and the second example of the second embodiment shown in FIG. 5B differ essentially only in their orientation. The photo detector as shown in FIG. 5A generally is easier to manufacture than the photo detector as shown in FIG. 5B because slanted structures, for example arranged in a 45-degree angle with respect to a coordinate system used for the manufacturing process, generally cannot be manufactured easily within a general manufacturing process like the CMOS manufacturing process or SOI CMOS manufacturing process, whereas structures comprising only elements arranged in zero or ninety degrees angles with respect to the coordinate system can easily be manufactured within such general manufacturing process.

Advantageously, the photo detector, according to the first or the second embodiment, is implemented and manufactured together with a circuit arrangement comprising at least one field effect transistor. The circuit arrangement is, for example, a CMOS logic circuit with optical inputs and, if applicable, optical outputs. The photo detector can be implemented as a respective optical input of the circuit arrangement. The photo detector as optical input allows for high speed chip to chip communication. The advantage of the photo detector according to the first or second embodiment is that it can be monolithically integrated on-chip with the circuit arrangement and can be manufactured within the same manufacturing process used for manufacturing the circuit arrangement without modification of the manufacturing process. The photo detector is thus suited even for low cost chips.

That which is claimed is:

1. A photo detector comprising:
    an active semiconductor layer, in which positively doped regions and negatively doped regions are formed, each comprising at least one electric contact area; and
    a grating of a grating material being directly or indirectly arranged on top of a surface of the active semiconductor layer and being patterned in uninterrupted first strips, that are arranged in a first direction and in parallel to each other with respect to their respective center lines in a first predetermined interval, and second strips, that are arranged in a second direction and in parallel to each other with respect to their respective center lines in a second predetermined interval, wherein the second strips comprise at least one interruption in a region between each two neighboring first strips in form of a predetermined gap, and the positively doped regions and negatively doped regions each being arranged as strips in parallel with the first strips of the grating material with respect to their respective center lines such that in a region between each two neighboring first strips of the grating material in their respective projections into the active semiconductor layer alternately either one of the positively doped regions or one of the negatively doped regions is arranged.

2. The photo detector according to claim 1, wherein:
    the active semiconductor layer is arranged on top of a dielectric layer having a lower refractive index than the active semiconductor layer and the grating material; and
    the active semiconductor layer and the grating are covered with at least one cover material having a lower refractive index than the active semiconductor layer and the grating material.

3. The photo detector according to claim 1, wherein the active semiconductor layer has a thickness of less than 200 nm.

4. The photo detector according to claim 1, wherein the positively doped regions and the negatively doped regions in the active semiconductor layer respectively extend at least to a border of the projection into the active semiconductor layer of the respective neighboring first strips or strips of the grating material, respectively.

5. The photo detector according to claim 1, wherein at least part of a region of the projection into the active semiconductor layer of the respective first strip or strip of the grating material, respectively, in the active semiconductor layer is intrinsic or lowly doped.

6. The photo detector according to claim 1, wherein between the grating and the active semiconductor layer a thin dielectric layer is arranged.

7. A photo detector comprising:
    an active semiconductor layer, in which positively doped regions and negatively doped regions are formed, each comprising at least one electric contact area; and
    a grating of a grating material being directly or indirectly arranged on top of a surface of the active semiconductor layer and being patterned in strips of the grating material, each strip comprising at least two sections arranged in two different directions, wherein all sections arranged in a first direction of the two different directions are arranged in parallel to each other in a first predetermined interval and all sections arranged in a second direction of the two different directions are arranged in parallel to each other in a second predetermined interval; and
    wherein the positively doped regions and negatively doped regions each being arranged as strips in parallel with the respective sections of the strips of the grating material with respect to their respective center lines such that in a region between each two neighboring strips of the grating material in their respective projections into the active semiconductor layer alternately either one of the positively doped regions or one of the negatively doped regions is arranged.

8. The photo detector according to claim 7, wherein each strip of the grating material with its respective sections is arranged in a zigzag pattern.

9. The photo detector according to claim 7, wherein:
    the active semiconductor layer is arranged on top of a dielectric layer having a lower refractive index than the active semiconductor layer and the grating material; and
    the active semiconductor layer and the grating are covered with at least one cover material having a lower refractive index than the active semiconductor layer and the grating material.

10. The photo detector according to claim 7, wherein the active semiconductor layer has a thickness of less than 200 nm.

11. The photo detector according to claim 7, wherein the positively doped regions and the negatively doped regions in the active semiconductor layer respectively extend at least to a border of the projection into the active semiconductor layer of the respective neighboring first strips or strips of the grating material, respectively.

12. The photo detector according to claim 7, wherein at least part of a region of the projection into the active semiconductor layer of the respective first strip or strip of the grating material, respectively, in the active semiconductor layer is intrinsic or lowly doped.

13. The photo detector according to claim 7, wherein between the grating and the active semiconductor layer a thin dielectric layer is arranged.

14. A photo detector comprising:
    an active semiconductor layer, in which positively doped regions and negatively doped regions are formed, each comprising at least one electric contact area; and a grating of a grating material being directly or indirectly arranged on top of a surface of the active semiconductor layer, the grating comprising:

(a) at least one area being patterned in strips of the grating material, each strip comprising at least two sections arranged in two different directions, wherein all sections arranged in a first direction of the two different directions are arranged in parallel to each other in a first predetermined interval and all sections arranged in a second direction of the two different directions are arranged in parallel to each other in a second predetermined interval; and (b) at least one area being patterned in uninterrupted first strips, that are arranged in a third direction and in parallel to each other with respect to their respective center lines in a third predetermined interval, and second strips, that are arranged in a fourth direction and in parallel to each other with respect to their respective center lines in a fourth predetermined interval, wherein the second strips comprise at least one interruption in a region between each two neighboring first strips in form of a predetermined gap; and (c) wherein the positively doped regions and negatively doped regions each being arranged as strips in parallel with the respective sections of the strips of the grating material and in parallel with the first strips of the grating material, respectively, with respect to their respective center lines such that in a region between each two neighboring strips of the grating material and neighboring first strips of the grating material, respectively, in their respective projections into the active semiconductor layer alternately either one of the positively doped regions or one of the negatively doped regions is arranged.

15. The photo detector according to claim 14, wherein each strip of the grating material with its respective sections is arranged in a zigzag pattern.

16. The photo detector according to claim 14, wherein:
the active semiconductor layer is arranged on top of a dielectric layer having a lower refractive index than the active semiconductor layer and the grating material; and
the active semiconductor layer and the grating are covered with at least one cover material having a lower refractive index than the active semiconductor layer and the grating material.

17. The photo detector according to claim 14, wherein the active semiconductor layer has a thickness of less than 200 nm.

18. The photo detector according to claim 14, wherein the positively doped regions and the negatively doped regions in the active semiconductor layer respectively extend at least to a border of the projection into the active semiconductor layer of the respective neighboring first strips or strips of the grating material, respectively.

19. The photo detector according to claim 14, wherein at least part of a region of the projection into the active semiconductor layer of the respective first strip or strip of the grating material, respectively, in the active semiconductor layer is intrinsic or lowly doped.

20. The photo detector according to claim 14, wherein between the grating and the active semiconductor layer a thin dielectric layer is arranged.

\* \* \* \* \*